United States Patent
Byl et al.

(10) Patent No.: US 9,960,042 B2
(45) Date of Patent: May 1, 2018

(54) CARBON DOPANT GAS AND CO-FLOW FOR IMPLANT BEAM AND SOURCE LIFE PERFORMANCE IMPROVEMENT

(71) Applicant: Entegris, Inc., Billerica, MA (US)

(72) Inventors: Oleg Byl, Southbury, CT (US); Edward A. Sturm, New Milford, CT (US); Ying Tang, Brookfield, CT (US); Sharad N. Yedave, Danbury, CT (US); Joseph D. Sweeney, New Milford, CT (US); Steven G. Sergi, Woodbury, CT (US); Barry Lewis Chambers, Midlothian, VA (US)

(73) Assignee: Entegris Inc., Billerica, MA (US)

( * ) Notice: Subject to any disclaimer, the term of this patent is extended or adjusted under 35 U.S.C. 154(b) by 0 days. days.

(21) Appl. No.: 14/378,963

(22) PCT Filed: Feb. 13, 2013

(86) PCT No.: PCT/US2013/025840
§ 371 (c)(1),
(2) Date: Aug. 14, 2014

(87) PCT Pub. No.: WO2013/122986
PCT Pub. Date: Aug. 22, 2013

(65) Prior Publication Data
US 2016/0020102 A1    Jan. 21, 2016

Related U.S. Application Data

(60) Provisional application No. 61/598,817, filed on Feb. 14, 2012, provisional application No. 61/625,571, filed on Apr. 17, 2012.

(51) Int. Cl.
*H01L 21/425* (2006.01)
*H01L 21/265* (2006.01)
(Continued)

(52) U.S. Cl.
CPC ........... *H01L 21/265* (2013.01); *H01J 37/08* (2013.01); *H01J 37/3171* (2013.01);
(Continued)

(58) Field of Classification Search
CPC ..... H01L 21/26506; H01L 2924/13091; H01L 21/02529
See application file for complete search history.

(56) References Cited

U.S. PATENT DOCUMENTS

| 3,602,778 A | 8/1971 | Ura et al. |
| 3,615,203 A | 10/1971 | Kaneko et al. |

(Continued)

FOREIGN PATENT DOCUMENTS

| CN | 101981661 A | 2/2011 |
| CN | 102339737 A | 2/2012 |

(Continued)

OTHER PUBLICATIONS

Jacobson, D., et al., "Ultra-high resolution mass spectroscopy of boron cluster ions", "Nuclear Instruments and Methods in Physics Research Section B: Beam Interactions with Materials and Atoms", Aug. 1, 2005, pp. 406-410 (Abstract and Figures), vol. 237, No. 1-2.

(Continued)

*Primary Examiner* — Jaehwan Oh
*Assistant Examiner* — Andre' C Stevenson

(57) ABSTRACT

Ion implantation processes and systems are described, in which carbon dopant source materials are utilized to effect carbon doping. Various gas mixtures are described, including a carbon dopant source material, as well as co-flow combinations of gases for such carbon doping. Provision of in situ cleaning agents in the carbon dopant source material is described, as well as specific combinations of carbon (Continued)

dopant source gases, hydride gases, fluoride gases, noble gases, oxide gases and other gases.

18 Claims, 3 Drawing Sheets

(51) Int. Cl.
  H01J 37/08      (2006.01)
  H01J 37/317     (2006.01)
  H01L 31/18      (2006.01)
  H01L 33/00      (2010.01)
(52) U.S. Cl.
  CPC ............ *H01L 31/18* (2013.01); *H01L 33/005* (2013.01); *H01J 2237/022* (2013.01)

(56) References Cited

U.S. PATENT DOCUMENTS

| | | | |
|---|---|---|---|
| 3,625,749 A | 12/1971 | Yoshioka et al. | |
| 3,658,586 A | 4/1972 | Wang | |
| 3,725,749 A | 4/1973 | Groves et al. | |
| 4,100,310 A | 7/1978 | Ura et al. | |
| 4,128,733 A | 12/1978 | Fraas et al. | |
| 4,600,801 A | 7/1986 | Guha et al. | |
| 4,657,774 A | 4/1987 | Satou et al. | |
| 4,680,358 A | 7/1987 | Yu | |
| 4,722,978 A | 2/1988 | Yu | |
| 4,803,292 A | 2/1989 | Ohfune et al. | |
| 4,851,255 A | 7/1989 | Lagendijk et al. | |
| 4,942,246 A | 7/1990 | Tanaka et al. | |
| 5,077,143 A | 12/1991 | Barraclough et al. | |
| 5,134,301 A | 7/1992 | Kamata et al. | |
| 5,347,460 A | 9/1994 | Gifford et al. | |
| 5,436,180 A | 7/1995 | de Fresart et al. | |
| 5,441,901 A | 8/1995 | Candelaria et al. | |
| 5,948,322 A | 9/1999 | Baum et al. | |
| 5,977,552 A | 11/1999 | Foad | |
| 5,993,766 A | 11/1999 | Tom et al. | |
| 6,001,172 A | 12/1999 | Bhandari et al. | |
| 6,096,467 A | 8/2000 | Shimizu et al. | |
| 6,135,128 A | 10/2000 | Graf et al. | |
| 6,221,169 B1 | 4/2001 | Bernstein et al. | |
| 6,346,452 B1 | 2/2002 | Kabir et al. | |
| 6,376,664 B1 | 4/2002 | Chan et al. | |
| 6,420,304 B1 | 7/2002 | Tsai et al. | |
| 6,486,227 B2 | 11/2002 | Nohr et al. | |
| 6,518,184 B1 | 2/2003 | Chambers et al. | |
| 6,600,092 B2 | 7/2003 | Lee | |
| 6,685,803 B2 | 2/2004 | Lazarovich et al. | |
| 6,730,568 B2 | 5/2004 | Sohn | |
| 6,780,896 B2 | 8/2004 | MacDonald et al. | |
| 6,835,414 B2 | 12/2004 | Ramm | |
| 6,841,141 B2 | 1/2005 | Arno et al. | |
| 6,852,610 B2 | 2/2005 | Noda | |
| 6,872,639 B2 | 3/2005 | DeBoer et al. | |
| 6,893,907 B2 | 5/2005 | Maydan et al. | |
| 6,905,947 B2 | 6/2005 | Goldberg | |
| 7,094,670 B2 | 8/2006 | Collins et al. | |
| 7,135,775 B2 | 11/2006 | Chambers et al. | |
| 7,138,768 B2 | 11/2006 | Maciejowski et al. | |
| 7,144,809 B2 | 12/2006 | Elers et al. | |
| 7,446,326 B2 | 11/2008 | Chaney et al. | |
| 7,553,758 B2 | 6/2009 | Park et al. | |
| 7,572,482 B2 | 8/2009 | Carothers et al. | |
| 7,666,770 B2 | 2/2010 | Sasaki et al. | |
| 7,819,981 B2 | 10/2010 | DiMeo, Jr. et al. | |
| 7,919,402 B2 | 4/2011 | Jacobson et al. | |
| 7,943,204 B2 | 5/2011 | Olander et al. | |
| 7,947,582 B2 | 5/2011 | Hautala et al. | |
| 8,013,312 B2 | 9/2011 | Adams | |
| 8,187,971 B2 | 5/2012 | Russell et al. | |
| 8,237,136 B2 | 8/2012 | Hautala et al. | |
| 8,252,651 B2 | 8/2012 | Kawasaki | |
| 2002/0011463 A1 | 1/2002 | Van Buskirk et al. | |
| 2002/0014407 A1 | 2/2002 | Allen et al. | |
| 2002/0018897 A1 | 2/2002 | Kuckertz et al. | |
| 2002/0033229 A1 | 3/2002 | Lebouitz et al. | |
| 2002/0155724 A1 | 10/2002 | Sakai et al. | |
| 2002/0160588 A1 | 10/2002 | Kim et al. | |
| 2003/0023118 A1 | 1/2003 | Kanayama et al. | |
| 2003/0049460 A1 | 3/2003 | O'Neill et al. | |
| 2003/0053799 A1 | 3/2003 | Lei | |
| 2004/0002202 A1 | 1/2004 | Horsky et al. | |
| 2004/0074285 A1 | 4/2004 | Dimeo, Jr. et al. | |
| 2004/0080050 A1 | 4/2004 | McMillin et al. | |
| 2004/0108296 A1 | 6/2004 | Kanayama et al. | |
| 2004/0110351 A1 | 6/2004 | Narasimha | |
| 2004/0166612 A1 | 8/2004 | Maydan et al. | |
| 2004/0200417 A1 | 10/2004 | Hanawa et al. | |
| 2004/0235280 A1 | 11/2004 | Keys et al. | |
| 2005/0191816 A1 | 9/2005 | Vanderpool et al. | |
| 2005/0202657 A1 | 9/2005 | Borland et al. | |
| 2005/0211923 A1* | 9/2005 | Banks | H01J 37/08 250/492.21 |
| 2006/0097193 A1 | 5/2006 | Horsky et al. | |
| 2006/0115590 A1 | 6/2006 | Suzuki et al. | |
| 2006/0115591 A1 | 6/2006 | Olander et al. | |
| 2006/0264051 A1 | 11/2006 | Thibaut | |
| 2007/0031325 A1 | 2/2007 | Carruthers et al. | |
| 2007/0059848 A1 | 3/2007 | Sasaki et al. | |
| 2007/0148888 A1 | 6/2007 | Krull et al. | |
| 2007/0178678 A1 | 8/2007 | Hatem et al. | |
| 2007/0178679 A1 | 8/2007 | Hatem et al. | |
| 2007/0241689 A1 | 10/2007 | Horsky et al. | |
| 2008/0108208 A1 | 5/2008 | Arevalo et al. | |
| 2008/0248636 A1 | 10/2008 | Olander et al. | |
| 2008/0299749 A1 | 12/2008 | Jacobson et al. | |
| 2008/0305598 A1 | 12/2008 | Horsky et al. | |
| 2009/0087578 A1 | 4/2009 | Hautala | |
| 2009/0221136 A1* | 9/2009 | Krueger | H01J 37/08 438/513 |
| 2010/0112795 A1 | 5/2010 | Kaim et al. | |
| 2010/0224264 A1 | 9/2010 | Homan et al. | |
| 2011/0021011 A1* | 1/2011 | Sweeney | C23C 14/06 438/515 |
| 2011/0079241 A1 | 4/2011 | Sinha et al. | |
| 2011/0143527 A1 | 6/2011 | Platow et al. | |
| 2011/0259366 A1 | 10/2011 | Sweeney et al. | |
| 2012/0015507 A1 | 1/2012 | Tanaka et al. | |
| 2012/0108044 A1 | 5/2012 | Kaim et al. | |
| 2012/0119113 A1 | 5/2012 | Colvin et al. | |
| 2012/0252195 A1 | 10/2012 | Jones et al. | |
| 2013/0078790 A1 | 3/2013 | Sweeney et al. | |
| 2014/0076234 A1 | 3/2014 | Kao et al. | |

FOREIGN PATENT DOCUMENTS

| | | |
|---|---|---|
| CN | 104272433 A | 1/2015 |
| CN | 1894763 A | 1/2017 |
| EP | 0079705 A1 | 5/1983 |
| EP | 0474108 A1 | 3/1992 |
| EP | 0656668 B1 | 3/1999 |
| EP | 2 815 424 B1 | 8/2017 |
| JP | 58-8071 A | 1/1983 |
| JP | 63-15228 A | 1/1988 |
| JP | 64-83147 A | 3/1989 |
| JP | 1-225117 A | 9/1989 |
| JP | 5-254808 A | 10/1993 |
| JP | 6-80681 A | 3/1994 |
| JP | 7-90201 A | 4/1995 |
| JP | 10-251592 A | 9/1998 |
| JP | 2002-343882 A | 11/2002 |
| KR | 10-2008-0033561 A | 4/2008 |
| KR | 10-2010-0029539 A | 3/2010 |
| TW | 521295 B | 2/2003 |
| TW | 574410 B | 2/2004 |
| TW | 200413111 A | 8/2004 |
| TW | 200523977 A | 7/2005 |
| TW | 200533777 A | 10/2005 |
| TW | 200628633 A | 8/2006 |
| TW | 201115617 A1 | 5/2011 |
| TW | 201137925 A | 11/2011 |
| TW | 201338022 A | 9/2013 |

(56) References Cited

FOREIGN PATENT DOCUMENTS

| WO | 9811764 A1 | 3/1998 |
|---|---|---|
| WO | 0143157 A1 | 6/2001 |
| WO | 03057667 A2 | 7/2003 |
| WO | 03100806 A1 | 12/2003 |
| WO | 2004003973 A2 | 1/2004 |
| WO | 2004053945 A2 | 6/2004 |
| WO | 2005027208 A1 | 3/2005 |
| WO | 2005037421 A2 | 4/2005 |
| WO | 2005059942 A2 | 6/2005 |
| WO | 2005060602 A2 | 7/2005 |
| WO | 2006047373 A2 | 5/2006 |
| WO | 2006069085 A2 | 6/2006 |
| WO | 2006095086 A2 | 9/2006 |
| WO | 2007027798 A2 | 3/2007 |
| WO | 2007120814 A2 | 10/2007 |
| WO | 2007127865 A2 | 11/2007 |
| WO | 2007134183 A2 | 11/2007 |
| WO | 2007136887 A2 | 11/2007 |
| WO | 2007146942 A2 | 12/2007 |
| WO | 2008121620 A1 | 10/2008 |
| WO | 2013/122986 A1 | 8/2013 |

OTHER PUBLICATIONS

Pelletier, J., et al., "Plasma-Based Ion Implantation and Deposition: A Review of Physics, Technology, and Applications", "IEEE Transactions on Plasma Science", Dec. 2005, pp. 1944-1959, vol. 33, No. 6.

Weast, R. (Ed.), "Physical Constants of Inorganic Compounds—Boric Acid", "Handbook of Chemistry and Physics, 56th Edition", Sep. 1975, pp. B-78, Publisher: CRC Press, Inc.

Weast, R. (Ed.), "Vapor Pressure Inorganic Compounds", "Handbook of Chemistry and Physics, 56 Ed.", Sep. 1975, pp. D-183-D-188, Publisher: CRC Press, Inc.

Translation of search report from Taiwan patent application 102105566, dated Oct. 5, 2016, 1 page.

* cited by examiner

US 9,960,042 B2

CARBON DOPANT GAS AND CO-FLOW FOR IMPLANT BEAM AND SOURCE LIFE PERFORMANCE IMPROVEMENT

CROSS-REFERENCE TO RELATED APPLICATIONS

This application is a U.S. national phase under the provisions of 35 U.S.C. § 371 of International Patent Application No. PCT/US13/25840 filed Feb. 13, 2013, which in turn claims the benefit of priority under the provisions of 35 U.S.C. § 119 of U.S. Provisional Patent Application No. 61/598,817 filed Feb. 14, 2012 and U.S. Provisional Patent Application No. 61/625,571 filed Apr. 17, 2012. The disclosures of International Patent Application No. PCT/US13/25840, U.S. Provisional Patent Application No. 61/598,817 and U.S. Provisional Patent Application No. 61/625,571 are hereby incorporated by reference herein, in their respective entireties.

FIELD

The present disclosure relates to ion implantation methods and systems, and more particularly, to carbon source materials for carbon ion implantation in such methods and systems.

DESCRIPTION OF THE RELATED ART

Ion implantation is used in integrated circuit fabrication to accurately introduce controlled amounts of dopant impurities into semiconductor wafers and is one of the processes of microelectronic/semiconductor manufacturing. In such implantation systems, an ion source ionizes a desired dopant element gas, and the ions are extracted from the source in the form of an ion beam of desired energy. Extraction is achieved by applying a high voltage across suitably-shaped extraction electrodes, which incorporate apertures for passage of the extracted beam. The ion beam is then directed at the surface of a workpiece, such as a semiconductor wafer, in order to implant the workpiece with the dopant element. The ions of the beam penetrate the surface of the workpiece to form a region of desired conductivity.

Several types of ion sources are used in ion implantation systems, including the Freeman and Bernas types that employ thermoelectrodes and are powered by an electric arc, microwave types using a magnetron, indirectly heated cathode (IHC) sources, and RF plasma sources, all of which typically operate in a vacuum. In any system, the ion source generates ions by introducing electrons into a vacuum arc chamber (hereinafter "chamber") filled with the dopant gas (commonly referred to as the "feedstock gas"). Collisions of the electrons with atoms and molecules in the dopant gas result in the creation of ionized plasma consisting of positive and negative dopant ions. An extraction electrode with a negative or positive bias will respectively allow the positive or negative ions to pass through an aperture as a collimated ion beam, which is accelerated towards the target material.

In many ion implantation systems, carbon, which is known to inhibit diffusion, is implanted into the target material to produce a desired effect in the integrated circuit device. The carbon is generally implanted from a feedstock gas such as carbon monoxide or carbon dioxide. The use of carbon monoxide or carbon dioxide gases can result in oxidation of the metal surfaces within the plasma source (arc chamber) of the ion implanter tool, and can also result in carbon residues depositing on electrical insulators. These phenomena reduce the performance of the implanter tool, thereby resulting in the need to perform frequent maintenance. Oxidation can result in inefficiencies in the implantation process.

Frequency and duration of preventive maintenance (PM) is one performance factor of an ion implantation tool. As a general tendency the tool PM frequency and duration should be decreased. The parts of the ion implanter tool that require the most maintenance include the ion source, which is generally serviced after approximately 50 to 300 hours of operation, depending on operating conditions; the extraction electrodes and high voltage insulators, which are usually cleaned after a few hundred hours of operation; and the pumps and vacuum lines of vacuum systems associated with the tool. Additionally, the filament of the ion source is often replaced on a regular basis.

Ideally, feedstock molecules dosed into an arc chamber would be ionized and fragmented without substantial interaction with the arc chamber itself or any other components of the ion implanter. In reality, feedstock gas ionization and fragmentation can results in such undesirable effects as arc chamber components etching or sputtering, deposition on arc chamber surfaces, redistribution of arc chamber wall material, etc. In particular, the use of carbon monoxide or carbon dioxide gases can result in carbon deposition within the chamber. This can be a contributor to ion beam instability, and may eventually cause premature failure of the ion source. The residue also forms on the high voltage components of the ion implanter tool, such as the source insulator or the surfaces of the extraction electrodes, causing energetic high voltage sparking. Such sparks are another contributor to beam instability, and the energy released by these sparks can damage sensitive electronic components, leading to increased equipment failures and poor mean time between failures (MTBF).

Accordingly, the art continues to seek new carbon dopant source materials and compositions that overcome the foregoing deficiencies.

SUMMARY

The present disclosure relates to methods and systems for implanting carbon ions in a substrate, e.g., a semiconductor article, flat panel display article, or solar panel article.

In one aspect, the disclosure relates to a method of ion implantation, comprising:
flowing a carbon dopant source composition to an ion implanter configured for carbon doping of a substrate; and operating the ion implanter to generate carbon dopant species from the carbon dopant source composition and to implant the carbon dopant species in the substrate,
wherein the carbon dopant source composition comprises at least one carbon dopant source material selected from the group consisting of:
  $CO$; $CO_2$; $CF_4$; $CH_4$; $COF_2$; $CH_2O$; $C_2F_4H_2$; $C_2H_6$; compounds of the formula $C_xF_wO_yH_zCl_vN_u$, wherein x is greater than or equal to 1, w is greater than or equal to 0, y is greater than or equal to 0, z is greater than or equal to 0, v is greater than or equal to 0, and u is greater than or equal to 0, with the proviso that at least one of w, y, z, v, and u has a non-zero value; hydrocarbons; alkanes (e.g., $CH_4$, $C_2H_6$, etc.); cyclic alkanes (including bi and multicyclic compounds, e.g., $C_4H_8$, $C_5H_{10}$, etc.); alkenes (e.g., $C_2H_4$, $C_3H_6$, ... $C_nH_{2n}$); cyclic alkenes (e.g., $C_4H_6$, $C_5H_8$, $C_nH_{2n-2}$); polyenes (e.g., $C_4H_8$, etc.); cyclic polyenes; alkynes (e.g., $C_2H_2$, $C_3H_4$, $C_nH_{2n-2}$); cyclic alkynes; arenes (e.g., $C_6H_6$, $C_{10}H_8$, etc.), and their derivatives; partially and fully halogenated hydrocarbons (e.g., $CH_2F_2$, $CF_4$, $C_2H_2F_4$, $C_2H_3F_3$, $C_6F_6$, etc.); alcohols of general formula ROH, wherein R is an organo moiety (e.g., $CH_3OH$, $C_2H_5OH$, etc.); halogenated alcohols (e.g., $FCH_2OH$, $F_2CHCH_2OH$, etc.); aldehydes (e.g., $CH_2O$, $CH_3COH$, etc.); ethers (e.g., $CH_3OCH_3$, etc.); halogenated ethers (e.g., $FCH_2OCH_2F$, etc.); esters (e.g., $HCOOCH_3$, $CH_3COOCH_3$, etc.); halogenated esters (e.g., $F_2CHCOOCH_3$, etc.); primary amines (e.g., $CH_3NH_2$, etc.), secondary amines (e.g., $(CH_3)_2NH$, etc.); tertiary amines (e.g., $(CH_3)_3N$, etc.); halogenated amines (e.g., $CF_3NH_2$, $(CFH_2)_3N$, etc.); N-halogenated amines (e.g., $CH_3NF_2$, $(CFH_2)_2NF$, etc.); nitro ($RNO_2$) and nitroso (RNO) alkyl and halogenated alkyl compounds (e.g., $CH_3NO_2$, $CH_3NO$, $FH_2CNO$, etc.); halides, wherein the number of carbon atoms is 1 (e.g., $COCl_2$, $CHF_3$, $CH_2F_2$, $CH_2F_2$, $CH_3F$, $F_3C-OH$, $F_2HC-OH$, etc.); halides containing two carbon atoms (e.g., $F_3C-COH$, $F_2HC-COH$, $H_3C-CH_2F$, $H_3C-CHF_2$, $H_3C-CF_3$, $H_2FC-CFH_2$, etc.); and halides and hydrides containing multiple carbon atoms (e.g., $C_6H_6$, $C_6H_5F$, $C_6H_4F_2$, $C_6H_3F_3$, $C_6H_2F_4$, $C_6HF_5$, etc.);

wherein the carbon dopant source material optionally is co-flowed to the ion implanter with at least one co-flow gas or is flowed to the ion implanter in mixture with at least one additional gas, wherein said at least one co-flow gas or at least one additional gas is selected from the group consisting of $H_2$, $PH_3$, $AsH_3$, $CH_4$, $GeH_4$, $SiH_4$, $NH_3$, $F_2$, $XeF_2$, $BF_3$, $SF_6$, $GeF_4$, $SiF_4$, $NF_3$, $N_2F_4$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, compounds of the formula $X_yF_z$ wherein X is any element in stoichiometric ratio with F, y≥1, and z≥1, compounds of the formula $C_aO_xH_yF_z$ wherein a≥0, x≥0, y≥0 and z≥1, compounds of the formula $C_xF_yH_z$ wherein x≥0, y>0, and z≥0, and fluorine-containing gases.

In another aspect, the disclosure relates to a method of cluster or molecular implantation of carbon in a substrate, using a carbon dopant selected from the group consisting of carbon ion, $C_x^+$, wherein x is greater than 1, and ions of the formula $C_xF_wO_yH_zCl_vN_u^+$ wherein x is greater than or equal to 1, and wherein the value of each of w, y, z, v, and u is 0 or higher, but wherein at least one is non-zero.

In a further aspect, the disclosure relates to an ion implantation process, comprising:

generating carbon dopant species by ionization of a carbon dopant source composition; and implanting the carbon dopant species in a substrate, wherein the carbon dopant source composition comprises carbon dopant source material selected from the group consisting of:

CO; $CO_2$; $CF_4$; $CH_4$; $COF_2$; $CH_2O$; $C_2F_4H_2$; $C_2H_6$; compounds of the formula $C_xF_wO_yH_zCl_vN_u$, wherein x is greater than or equal to 1, w is greater than or equal to 0, y is greater than or equal to 0, z is greater than or equal to 0, v is greater than or equal to 0, and u is greater than or equal to 0, with the proviso that at least one of w, y, z, v, and u has a non-zero value; hydrocarbons; alkanes (e.g., $CH_4$, $C_2H_6$, etc.); cyclic alkanes (including bi and multicyclic compounds, e.g., $C_4H_8$, $C_5H_{10}$, etc.); alkenes (e.g., $C_2H_4$, $C_3H_6$, . . . $C_nH_{2n}$); cyclic alkenes (e.g., $C_4H_6$, $C_5H_8$, $C_nH_{2n-2}$); polyenes (e.g., $C_4H_8$, etc.); cyclic polyenes; alkynes (e.g., $C_2H_2$, $C_3H_4$, $C_nH_{2n-2}$); cyclic alkynes; arenes (e.g., $C_6H_6$, $C_{10}H_8$, etc.), and their derivatives; partially and fully halogenated hydrocarbons (e.g., $CH_2F_2$, $CF_4$, $C_2H_2F_4$, $C_2H_3F_3$, $C_6F_6$, etc.); alcohols of general formula ROH, wherein R is an organo moiety (e.g., $CH_3OH$, $C_2H_5OH$, etc.); halogenated alcohols (e.g., $FCH_2OH$, $F_2CHCH_2OH$, etc.); aldehydes (e.g., $CH_2O$, $CH_3COH$, etc.); ethers (e.g., $CH_3OCH_3$, etc.); halogenated ethers (e.g., $FCH_2OCH_2F$, etc.); esters (e.g., $HCOOCH_3$, $CH_3COOCH_3$, etc.); halogenated esters (e.g., $F_2CHCOOCH_3$, etc.); primary amines (e.g., $CH_3NH_2$, etc.), secondary amines (e.g., $(CH_3)_2NH$, etc.); tertiary amines (e.g., $(CH_3)_3N$, etc.); halogenated amines (e.g., $CF_3NH_2$, $(CFH_2)_3N$, etc.); N-halogenated amines (e.g., $CH_3NF_2$, $(CFH_2)_2NF$, etc.); nitro ($RNO_2$) and nitroso (RNO) alkyl and halogenated alkyl compounds (e.g., $CH_3NO_2$, $CH_3NO$, $FH_2CNO$, etc.); halides, wherein the number of carbon atoms is 1 (e.g., $COCl_2$, $CHF_3$, $CH_2F_2$, $CH_2F_2$, $CH_3F$, $F_3C-OH$, $F_2HC-OH$, etc.); halides containing two carbon atoms (e.g., $F_3C-COH$, $F_2HC-COH$, $H_3C-CH_2F$, $H_3C-CHF_2$, $H_3C-CF_3$, $H_2FC-CFH_2$, etc.); and halides and hydrides containing multiple carbon atoms (e.g., $C_6H_6$, $C_6H_5F$, $C_6H_4F_2$, $C_6H_3F_3$, $C_6H_2F_4$, $C_6HF_5$, etc.);

wherein the carbon dopant source material is flowed to the generating with at least one co-flow gas or in mixture with at least one additional gas, wherein said at least one co-flow gas or at least one additional gas is selected from the group consisting of $H_2$, $PH_3$, $AsH_3$, $CH_4$, $GeH_4$, $SiH_4$, $NH_3$, $F_2$, $XeF_2$, $BF_3$, $SF_6$, $GeF_4$, $SiF_4$, $NF_3$, $N_2F_4$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, compounds of the formula $X_yF_z$ wherein X is any element in stoichiometric ratio with F, y≥1, and z≥1, compounds of the formula $C_aO_xH_yF_z$ wherein a≥0, x≥0, y≥0 and z≥1, compounds of the formula $C_xF_yH_z$ wherein x≥0, y>0, and z≥0, and fluorine-containing gases.

A further aspect of the disclosure relates to an ion implantation system, comprising:

an ion implanter configured to receive carbon dopant source material, generate carbon dopant species therefrom, and implant the carbon dopant species in a substrate; and a supply assembly arranged to deliver carbon dopant source material to the ion implanter, wherein the supply assembly comprises carbon dopant source material selected from the group consisting of:

CO; $CO_2$; $CF_4$; $CH_4$; $COF_2$; $CH_2O$; $C_2F_4H_2$; $C_2H_6$; compounds of the formula $C_xF_wO_yH_zCl_vN_u$, wherein x is greater than or equal to 1, w is greater than or equal to 0, y is greater than or equal to 0, z is greater than or equal to 0, v is greater than or equal to 0, and u is greater than or equal to 0, with the proviso that at least one of w, y, z, v, and u has a non-zero value; hydrocarbons; alkanes (e.g., $CH_4$, $C_2H_6$, etc.); cyclic alkanes (including bi and multicyclic compounds, e.g., $C_4H_8$, $C_5H_{10}$, etc.); alkenes (e.g., $C_2H_4$, $C_3H_6$, . . . $C_nH_{2n}$); cyclic alkenes (e.g., $C_4H_6$, $C_5H_8$, $C_nH_{2n-2}$); polyenes (e.g., $C_4H_8$, etc.); cyclic polyenes; alkynes (e.g., $C_2H_2$, $C_3H_4$, $C_nH_{2n-2}$); cyclic alkynes; arenes (e.g., $C_6H_6$, $C_{10}H_8$, etc.), and their derivatives; partially and fully halogenated hydrocarbons (e.g., $CH_2F_2$, $CF_4$, $C_2H_2F_4$, $C_2H_3F_3$, $C_6F_6$, etc.); alcohols of general formula ROH, wherein R is an organo moiety (e.g., $CH_3OH$, $C_2H_5OH$, etc.); halogenated alcohols (e.g., $FCH_2OH$, $F_2CHCH_2OH$, etc.); aldehydes (e.g., $CH_2O$, $CH_3COH$, etc.); ethers (e.g., $CH_3OCH_3$, etc.); halogenated ethers (e.g., $FCH_2OCH_2F$, etc.); esters (e.g., $HCOOCH_3$, $CH_3COOCH_3$, etc.); halogenated esters (e.g., $F_2CHCOOCH_3$, etc.); primary amines (e.g., $CH_3NH_2$, etc.), secondary amines (e.g., $(CH_3)_2NH$, etc.); tertiary amines (e.g., $(CH_3)_3N$, etc.); halogenated amines (e.g., $CF_3NH_2$, $(CFH_2)_3N$, etc.); N-halogenated amines (e.g., $CH_3NF_2$, $(CFH_2)_2NF$, etc.); nitro ($RNO_2$) and nitroso (RNO) alkyl and halogenated alkyl compounds (e.g., $CH_3NO_2$, $CH_3NO$, $FH_2CNO$, etc.); halides, wherein the number of carbon atoms is 1 (e.g., $COCl_2$, $CHF_3$, $CH_2F_2$, $CH_2F_2$, $CH_3F$, $F_3C—OH$, $F_2HC—OH$, etc.); halides containing two carbon atoms (e.g., $F_3C—COH$, $F_2HC—COH$, $H_3C—CH_2F$, $H_3C—CHF_2$, $H_3C—CF_3$, $H_2FC—CFH_2$, etc.); and halides and hydrides containing multiple carbon atoms (e.g., $C_6H_6$, $C_6H_5F$, $C_6H_4F_2$, $C_6H_3F_3$, $C_6H_2F_4$, $C_6HF_5$, etc.);

wherein the carbon dopant source material is flowed to the ion implanter with at least one co-flow gas or in mixture with at least one additional gas, wherein said at least one co-flow gas or at least one additional gas is selected from the group consisting of $H_2$, $PH_3$, $AsH_3$, $CH_4$, $GeH_4$, $SiH_4$, $NH_3$, $F_2$, $XeF_2$, $BF_3$, $SF_6$, $GeF_4$, $SiF_4$, $NF_3$, $N_2F_4$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, compounds of the formula $X_yF_z$ wherein X is any element in stoichiometric ratio with F, y≥1, and z≥1, compounds of the formula $C_aO_xH_yF_z$ wherein a≥0, x≥0, y≥0 and z≥1, compounds of the formula $C_xF_yH_z$ wherein x≥0, y>0, and z≥0, and fluorine-containing gases.

Another aspect of the disclosure relates to a gas combination composition comprising (A) one or more carbon dopant source gas(es) of the present disclosure, and at least one additional gas selected from the group consisting of (B) one or more fluorocompound gas(es), (C) one or more noble gases, (D) one or more oxide gases, and (E) other gases (e.g., $N_2$, $H_2$).

A further aspect of the disclosure relates to a method of ion implantation of carbon in a substrate, comprising carbon doping the substrate using a gas combination composition of the present disclosure. Such gas flow combination compositions contain at least two different gas compounds, and may contain any suitable numbers of gas components, e.g., 2, 3, or more components.

Another aspect of the disclosure relates to a method of improving beam current in a carbon ion implantation process, wherein carbon dopant source material is delivered to the ion implantation process in mixture and/or co-flow relationship with one or more fluorocompound gas(es) selected from the group consisting of $F_2$, $COF_2$, $CF_4$, $MoF_6$, $B_2F_4$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, y≥1, and z≥1, and compounds of the formula $C_aO_xH_yF_z$ wherein a≥0, x≥0, y≥0 and z≥1, and compounds of the formula $C_xF_yH_z$ wherein x≥0, y>0, and z≥0.

Yet another aspect of the disclosure relates to an ion implantation system, comprising:

an ion implanter configured to receive carbon dopant source material, generate carbon dopant species therefrom, and implant the carbon dopant species in a substrate; and a supply assembly arranged to deliver carbon dopant source material to the ion implanter, wherein the carbon dopant source material is in mixture with or in co-flow relationship to one or more fluorocompound gas(es) selected from the group consisting of $F_2$, $COF_2$, $CF_4$, $MoF_6$, $B_2F_4$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, y≥1, and z≥1, and compounds of the formula $C_aO_xH_yF_z$ wherein a≥0, x≥0, y≥0 and z≥1, and compounds of the formula $C_xF_yH_z$ wherein x≥0, y>0, and z≥0.

The use of carbon dopant source material co-flowed to the ion implanter with at least one co-flow gas or is flowed to the ion implanter in mixture with at least one additional gas, in accordance with the present disclosure, can be employed to enhance operational character of the ion implanter in at least one of recipe transition, beam stability, source life, beam uniformity, beam current, and cost of ownership, relative to corresponding operation of the ion implanter without any such co-flow gas or additional gas.

Other aspects, features and embodiments of the invention will be more fully apparent from the ensuing disclosure and appended claims.

DETAILED DESCRIPTION

Figure 1:
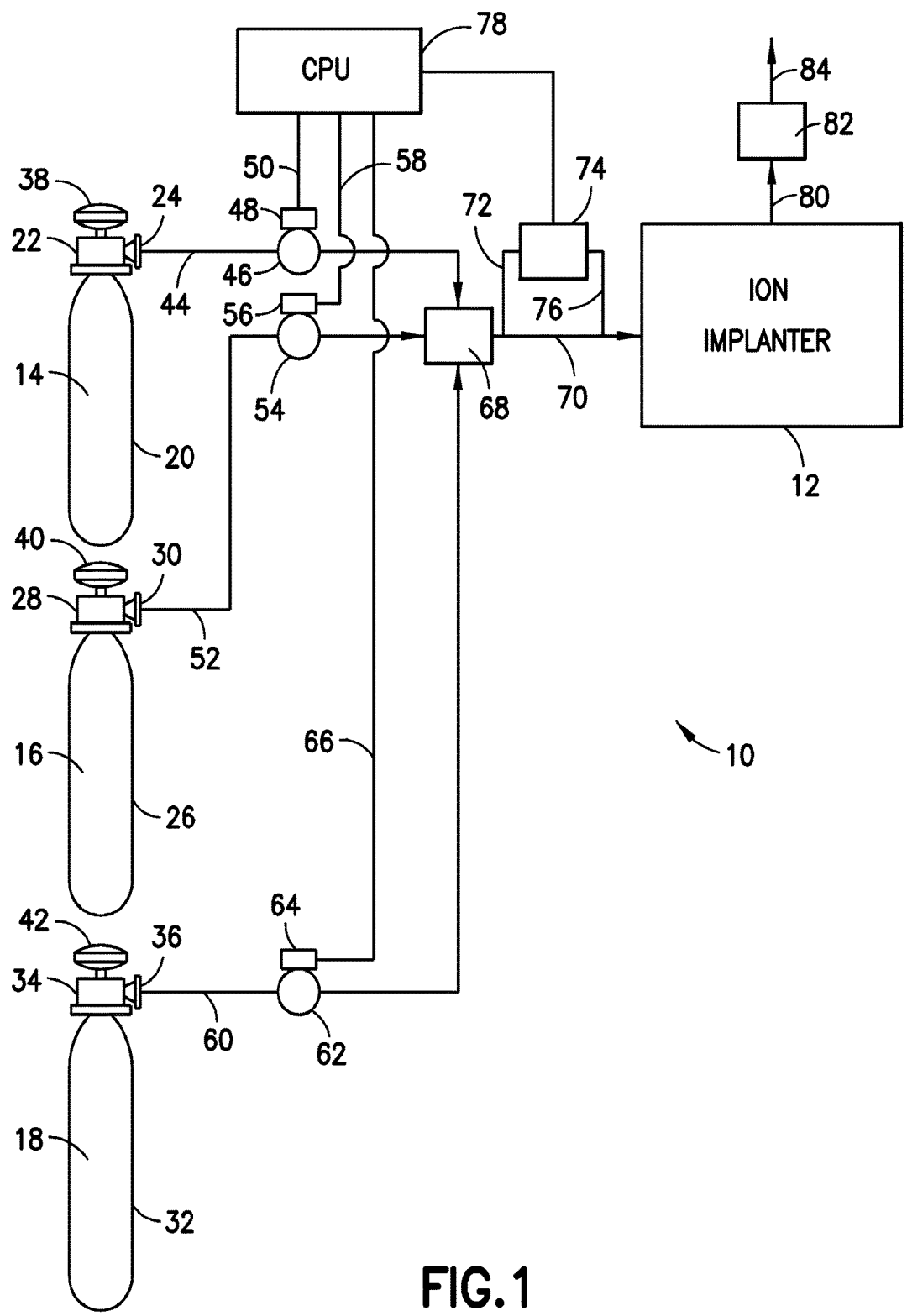
FIG. 1 is a schematic representation of an ion implantation system illustrating modes of operation according to the present disclosure in which a carbon dopant source material is supplied to an ion implanter for implantation of carbon in a substrate.

The present disclosure relates to systems and methods for implantation of carbon in substrates, including carbon dopant source materials and compositions.

As used herein, and in the appended claims, the singular forms "a", "and", and "the" include plural referents unless the context clearly dictates otherwise.

Organo moieties of compounds herein, and organic compounds themselves, may be of any suitable type, and may for example comprise elements C, H, and optionally heteroatoms such as O, N, Si, etc. Such moieties and organic compounds of the present disclosure may have any suitable carbon number, e.g., $C_1$-$C_{12}$, or higher, in stoichiometric ratio with other elements therein.

As used herein, the identification of a carbon number range, e.g., in $C_1$-$C_{12}$, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

The compounds of the present disclosure may be further specified in specific embodiments by provisos or limitations excluding specific substituents, groups, moieties or structures, in relation to various specifications and exemplifications thereof set forth herein. Thus, the disclosure contemplates restrictively defined compositions, e.g., a composition wherein $R^i$ is $C_1$-$C_{12}$ alkyl, with the proviso that $R^i \neq C_4$ alkyl when $R^j$ is silyl.

The present disclosure relates to ion implantation using carbon dopant source materials of varying types. The disclosure contemplates the use of the following carbon dopant source materials: CO, $CO_2$, $CF_4$, $CH_4$, $COF_2$, $CH_2O$, $C_2F_4H_2$, $C_2H_6$, compounds of the formula $C_xF_wO_yH_zCl_vN_u$, wherein x is greater than or equal to 1, w is greater than or equal to 0, y is greater than or equal to 0, z is greater than or equal to 0, v is greater than or equal to 0, and u is greater than or equal to 0, with the proviso that at least one of w, y, z, v, and u has a non-zero value; hydrocarbons, alkanes ($CH_4$, $C_2H_6$, etc.), cyclic alkanes (including bi and multi-cyclic compounds, $C_4H_8$, $C_5H_{10}$, etc.), alkenes ($C_2H_4$, $C_3H_6$, ... $C_nH_{2n}$), cyclic alkenes ($C_4H_6$, $C_5H_8$, $C_nH_{2n-2}$), polyenes ($C_4H_8$, etc.), cyclic polyenes, alkynes ($C_2H_2$, $C_3H_4$, $C_nH_{2n-2}$), cyclic alkynes, arenes ($C_6H_6$, $C_{10}H_8$, etc.), and their derivatives; partially and fully halogenated hydrocarbons ($CH_2F_2$, $CF_4$, $C_2H_2F_4$, $C_2H_3F_3$, $C_6F_6$, etc.); alcohols of general formula ROH, wherein R is an organo moiety ($CH_3OH$, $C_2H_5OH$, etc.); halogenated alcohols ($FCH_2OH$, $F_2CHCH_2OH$, etc.); aldehydes ($CH_2O$, $CH_3COH$, etc.); ethers ($CH_3OCH_3$, etc.); halogenated ethers ($FCH_2OCH_2F$, etc.); esters ($HCOOCH_3$, $CH_3COOCH_3$, etc.); halogenated esters ($F_2CHCOOCH_3$, etc.); amines (primary, $CH_3NH_2$, etc.), secondary amines (($CH_3$)$_2NH$, etc.); tertiary amines (($CH_3$)$_3N$, etc.); halogenated amines ($CF_3NH_2$, ($CFH_2$)$_3N$, etc.); and N-halogenated amines ($CH_3NF_2$, ($CFH_2$)$_2NF$, etc.); nitro (RNO2) and nitroso (RNO) alkyl and halogenated alkyl compounds e.g. $CH_3NO_2$, $CH_3NO$, $FH_2CNO$; halides, wherein the number of carbon atoms is 1 ($COCl_2$, $CHF_3$, $CH_2F_2$, $CH_2F_2$, $CH_3F$, $F_3C$—OH, $F_2HC$—OH, etc.); halides containing 2 carbon atoms ($F_3C$—COH, $F_2HC$—COH, $H_3C$—$CH_2F$, $H_3C$—$CHF_2$, $H_3C$—$CF_3$, $H_2FC$—$CFH_2$, etc.); and halides and hydrides containing multiple carbon atoms ($C_6H_6$, $C_6H_5F$, $C_6H_4F_2$, $C_6H_3F_3$, $C_6H_2F_4$, $C_6HF_5$, etc.).

The foregoing carbon dopant source materials can be utilized in neat form, or in mixtures of different carbon dopant materials, e.g., as gas mixtures. Additionally, the disclosure contemplates the use of carbon dopant source materials of such type, in combination with co-flow gases. Such co-flow gases used with carbon dopant source materials of the present disclosure include hydrides, fluorides, noble gases, oxide gases, and other gases.

In various embodiments, the carbon dopant source material is co-flowed to the ion implanter with at least one co-flow gas or is flowed to the ion implanter in mixture with at least one additional gas, wherein the at least one co-flow gas or at least one additional gas is selected from the group consisting of $H_2$, $PH_3$, $AsH_3$, $CH_4$, $GeH_4$, $SiH_4$, $NH_3$, $N_2F_4$, $F_2$, $XeF_2$, $BF_3$, $SF_6$, $GeF_4$, $SiF_4$, $NF_3$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, compounds of the formula $X_yF_z$ wherein X is any element in stoichiometric ratio with F, $y \geq 1$, and $z \geq 1$, compounds of the formula $C_aO_xH_yF_z$ wherein $a \geq 0$, $x \geq 0$, $y \geq 0$ and $z \geq 1$, compounds of the formula $C_xF_yH_z$ wherein $x \geq 0$, $y > 0$, and $z \geq 0$, and fluorine-containing gases.

Illustrative co-flow hydride gases include $H_2$, $PH_3$, $AsH_3$, $CH_4$, $GeH_4$, $SiH_4$, and $NH_3$.

Illustrative co-flow fluoride gases useful with the carbon dopant source materials of the disclosure include $F_2$, $XeF_2$, $BF_3$, $SF_6$, $GeF_4$, $SiF_4$, $NF_3$, HF, $WF_6$, and $MoF_6$.

Noble gases that may be employed as co-flow components with carbon dopant source materials of the disclosure include Ar, Ne, Kr, Xe, and He.

Oxide gas co-flow components useful with the carbon dopant source materials include $O_2$, $O_3$, $H_2O_2$, and $H_2O$.

Other gases that may be employed as co-flow gases in use of the carbon dopant source materials of the present disclosure include $Cl_2$, $F_2$, $N_2$ and HCl.

In one embodiment, carbon monoxide (CO) is utilized as a carbon dopant source gas, which may be in mixture, or alternatively may be co-flowed with co-flow gases such as: hydrides (e.g., $H_2$, $PH_3$, $AsH_3$, $CH_4$, $GeH_4$, $SiH_4$); fluoride gases (e.g., $F_2$, $XeF_2$, $BF_3$, $SF_6$, $GeF_4$, $CF_4$, $SiF_4$); inert gases (e.g., Ar, Kr, Xe, He); oxide gases (e.g., $O_2$, $O_3$, $H_2O_2$, and $H_2O$); and/or other gases such as $Cl_2$, $COF_2$, $CH_2O$, or $C_2F_4H_2$. In such mixtures or co-flow arrangements, multiple ones of the foregoing gases could be utilized with CO, in various mixtures or co-flow ratios to achieve desired performance in the ion implantation operation.

In another aspect, the disclosure relates to use of carbon dopant gases such as $CF_4$, $CH_4$, $COF_2$, $CH_2O$, or $C_2F_4H_2$, in mixture or co-flow with hydrides ($H_2$, $PH_3$, $AsH_3$, $CH_4$, $GeH_4$, $SiH_4$); fluoride gases ($F_2$, $XeF_2$, $BF_3$, $SF_6$, $GeF_4$, $CF_4$, $SiF_4$); inert gases (Ar, Kr, Xe, He); or other gases such as $Cl_2$, $COF_2$, $CH_2O$, $C_2F_4H_2$, $PF_3$, $PF_5$, or other fluorine-containing gases. The co-flow gas could comprise multiple ones of the above gases with different co-flow ratios, or the carbon dopant gas could be utilized in combination with multiple ingredients in a multicomponent gas mixture, wherein the relative proportions of the gas components may be appropriately varied to achieve a desired or necessary result in the ion implantation operation.

In another aspect, the disclosure contemplates specific gas mixtures or co-flow arrangements involving the following gases:

CO+$H_2$
CO+$H_2$+$XeF_2$
CO+$CH_4$
CO+$COF_2$
CO+$COF_2$+$O_2$+$H_2$
CO+$BF_3$
CO+$PH_3$
CO+$SF_6$
CO+$SiF_4$
$CO_2$+$H_2$
$CO_2$+$H_2$+$XeF_2$
$CO_2$+$CH_4$
$CO_2$+$COF_2$
$CO_2$+$COF_2$+$O_2$+$H_2$
$CO_2$+$BF_3$
$CO_2$+$PH_3$
$CO_2$+$SF_6$
$CO_2$+$SiF_4$
$C_nH_y$+$O_2$ $C_nH_y+F_2$
$C_xH_y+$noble gas
$COF_2+H_2$ wherein x and y have any appropriate stoichiometric values.

The foregoing carbon dopant source compositions including gas mixtures as well as co-flow gas components, may be utilized in the ion implant operation to implant a wide variety of substrates for production of corresponding products. For example, the substrate implanted with carbon in accordance with the present disclosure may comprise a semiconductor for manufacture of a semiconductor article, a flat panel display article, LED article, or a solar panel article. Such article may be a component, subassembly or structural portion of the final product article.

The disclosure contemplates the use of carbon dopant gas materials in combinations and at concentrations and volumetric flow rates that may be varied to provide desired source life of the ion source in the ion implantation system, or otherwise to improve performance of the ion implanter.

In a further aspect, the disclosure contemplates mixing a small amount of a cleaning gas with the carbon dopant source material to effect cleaning and transport of tungsten back to the tungsten filament in the ion source, and to form volatile fluorides or other volatiles by reaction with deposits in the system and to thereby enable such deposits as volatilized to be pumped out of the system. The cleaning gas may be of any suitable type, and may for example comprise fluorine or $COF_2$, or any other oxygen-containing gas, or any other fluorine-containing gas, and optionally inert gas may be employed as a carrier medium to transport the cleaning gas to the ion implanter.

The use of an in situ cleaning gas provides a marked improvement in ion implanter performance, extending the mean time between failure (MTBF), and improving uptime and reducing downtime of the ion implanter system.

The disclosure further contemplates cluster or molecular implant, utilizing a carbon dopant source gas such as a gas described above, or a mixture containing such carbon dopant source gas or gases in a multicomponent dopant source material. Cluster or molecular implant may be carried out with only carbon ion, $C_x^+$, wherein x is greater than 1. Cluster or molecular implant can also be carried out with ions of the formula $C_xF_wO_yH_zCl_vN_u^+$ wherein x is greater than or equal to 1, and wherein the value of each of w, y, z, v, and u is 0 or higher, but wherein at least one is non-zero. In still other embodiments, cluster implantation can be carried out using $C_6H_6^+$.

Referring now to the drawings, FIG. 1 is a schematic representation of an ion implantation system adapted for carbon doping of substrates in accordance with one implementation of the disclosure.

As illustrated in FIG. 1, implantation system 10 includes an ion implanter 12 that is arranged in receiving relationship to dopant gas sources 14, 16 and 18, for delivering dopant source gas to the implanter.

Carbon dopant gas source 14 includes a vessel containing the carbon dopant source gas. The vessel includes a valve head assembly 22 with a discharge port 24 joined to carbon dopant source gas feed line 44. The valve head assemble 22 is equipped with a hand wheel 38, for manual adjustment of the valve in the valve head assembly, to translate same between fully open and fully closed positions, as desired, to effect dispensing or alternatively, closed storage, of the gas contained in vessel 20.

Co-flow gases are also contained in co-flow sources 16 and 18, each constructed in similar manner to source 14. Co-flow source 16 comprises a vessel 26 equipped with a valve head assembly 28 to which is coupled a hand wheel 40. The valve head assembly 28 includes a discharge port 30 to which is joined a co-flow gas feed line 52.

Source 18 includes vessel 32 equipped with a valve head assembly 34 to which is coupled hand wheel 42 for actuation of the valve in the valve head assembly 34. The valve head assembly 34 also includes discharge port 36 joined to co-flow gas discharge line 60.

In the arrangement shown, a dopant source gas, or multiple dopant source gases may be supplied, or a dopant gas or gases, and non-dopant co-flow gas or gases, may be supplied, in any desired combinations. Thus, the illustrated arrangement permits three dopant source gases, or alternatively one dopant source gas and two co-flow gases, or alternatively two dopant source gases and one co-flow gas, to be selectively dispensed for flow to the mixing chamber 68.

For the purpose of controlling flow from the respective sources, the respective gas feed lines 44, 52 and 60 are provided with flow control valves 46, 54 and 62 therein, respectively.

Flow control valve 46 is equipped with an automatic valve actuator 48, having signal transmission line 50 connecting the actuator to CPU 78, whereby CPU 78 can transmit control signals in signal transmission line 50 to the valve actuator to modulate the position of the valve 46, to correspondingly control the flow of gas from vessel 20 to the mixing chamber 68.

In like manner, gas discharge line 52 contains flow control valve 54 coupled with valve actuator 56 that in turn is coupled by signal transmission line 58 to the CPU 78. Correspondingly, flow control valve 62 in gas discharge line 60 is equipped with valve actuator 64 coupled by signal transmission line 66 to the CPU 78.

In this manner, the CPU can operatively control the flow of the respective gases from the corresponding vessels 20, 26 and 32.

In the event that gases are concurrently flowed (co-flowed) to mixing chamber 68, the resulting gas is then discharged to feed line 70 for passage to the ion implanter 12.

Correspondingly, if only a single source 14, 16 or 18 is operated in dispensing mode, the corresponding single gas then flows through the mixing chamber, as modulated by the associated flow control valve, and is passed in feed line 70 to the ion implanter.

Feed line 70 is coupled with a bypass flow loop comprised of bypass lines 72 and 76 communicating with the feed line, and with gas analyzer 74. The gas analyzer 74 thus receives a side stream from the main flow in feed line 70, and responsively generates a monitoring signal correlative of the concentration, flow rate, etc. of the gas stream and transmits a monitoring signal in the signal transmission line coupling the analyzer 74 with CPU 78. In such manner, the CPU 78 receives the monitoring signal from gas analyzer 74, processes same and responsively generates output control signals that are sent to the respective valve actuators 48, 56 and 64, or selected one or ones thereof, as appropriate, to effect the desired dispensing operation of gas to the ion implanter.

The ion implanter 12 produces an effluent that is flowed in effluent line 80 to effluent treatment unit 82, which may treat the effluent by effluent treatment operations including scrubbing, catalytic oxidation, etc., to generate a treated gas effluent that is discharged from the treatment unit 82 in vent line 84, and may be passed to further treatment or other disposition.

The CPU 78 may be of any suitable type, and may variously comprise a general purpose programmable computer, a special purpose programmable computer, a programmable logic controller, microprocessor, or other computational unit that is effective for signal processing of the monitoring signal and generation of an output control signal or signals, as above described.

The CPU thus may be programmatically configured to effect a cyclic operation including concurrent flow of gases from two or all three of the sources 14, 16 and 18, with the respective gases being flowed in sequence. Thus, any flow mode involving co-flow or mixture of gases, or sequential gas flows, may be accommodated.

It will therefore be recognized that carbon doping of a substrate in the ion implanter may be carried out in any of various manners, to utilize the carbon dopant gas singly or in combination with other gas species. It will therefore be appreciated that the carbon dopant gas may be variously combined with hydride gas, fluoride gas, noble gas, oxide gas or other gas in various implementations of the ion implantation system shown in FIG. 1, or in ion implantation systems correspondingly configured for operation in accordance with the disclosure.

In one embodiment, a mixture of gases may be utilized in the ion implantation operation. For example, multiple carbon dopant source gases, e.g., up to ten in number or more, can be utilized, employing the gas species previously described.

Gas mixtures of the carbon dopant source gas and hydride(s), fluoride(s), noble gas(es), oxide gas(es) or other gas(es) may be employed, in which the number of gas species can vary from one to twenty in number for a single carbon dopant source gas, in various embodiments. Alternatively, if multiple carbon dopant source gases are employed, further gas species can be employed as selected from among the hydride gases, fluoride gases, noble gases, oxide gases and/or other gases described, with up to twenty species or more in number. In such multicomponent gas mixtures, or co-flow of multiple gas species, the percentage of each gas can be varied relative to the other gas species. In mixtures, for example, the percentage of each gas in the mixture can independently range from 0.001% by volume to 99.999% by volume, based on total volume of the respective gases in the gas mixture, with the requirement that the volume percents of all gas species in the mixture total to 100 volume percent.

Accordingly, the disclosure contemplates gas combination composition comprising (A) one or more carbon dopant source gas(es), and at least one additional gas selected from the group consisting of (B) one or more fluorocompound gas(es), (C) one or more noble gases, (D) one or more oxide gases, and (E) other gases (e.g., $N_2$, $H_2$, etc.). The one or more carbon dopant source gas(es) may comprise any of the carbon dopant source gas(es) disclosed herein.

In a specific embodiment, the gas combination composition comprises (A) one or more carbon dopant source gas(es), and (B) one or more fluorocompound gas(es), wherein the carbon dopant source gas(es) (A) is/are selected from the group consisting of CO, $CO_2$, $COF_2$, and $C_aO_xH_yF_z$ wherein $a \geq 1$, $x \geq 0$, $y \geq 0$ and $z \geq 0$, and the fluorocompound gas(es) (B) is/are selected from the group consisting of $F_2$, $COF_2$, $CF_4$, $MoF_6$, $B_2F_4$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, $y \geq 1$, and $z \geq 1$, compounds of the formula $C_aO_xH_yF_z$ wherein $a \geq 0$, $x \geq 0$, $y \geq 0$ and $z \geq 1$, and compounds of the formula $C_xF_yH_z$ wherein $x \geq 0$, $y > 0$, and $z \geq 0$, e.g., compounds such as $CF_4$, $CF_3H$, $CF_2H_2$, $CFH_3$, etc. In such gas combination compositions, gases containing both carbon and fluorine atoms can be in group (A) and/or group (B).

The disclosure in another aspect relates to gas combination compositions comprising (A) one or more carbon dopant source gas(es) and (B) one or more fluorocompound gas(es), which are useful for carbon doping of substrates, e.g., semiconductor, solar, LED, or flat panel substrates with improved performance of the ion implanter, in relation to corresponding carbon doping in the absence of the fluorocompound gas(es). For example, the fluorocompound gas(es) may result in higher beam current, reduced amounts of deposited residues in the ion implanter, reduced mean time between failures, reduced levels of required maintenance, etc.

In such gas combination compositions, the carbon dopant source gas(es) (A) is/are selected from the group consisting of CO, $CO_2$, $CF_4$, $COF_2$, and $C_aO_xH_yF_z$ wherein $a \geq 1$, $x \geq 0$, $y \geq 0$ and $z \geq 0$, and the fluorocompound gas(es) (B) is/are selected from the group consisting of $F_2$, $COF_2$, $CF_4$, $MoF_6$, $B_2F_4$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, $y \geq 1$, and $z \geq 1$, compounds of the formula $C_aO_xH_yF_z$ wherein $a \geq 0$, $x \geq 0$, $y \geq 0$ and $z \geq 1$ (e.g., $CF_4$ or $COF_2$), and compounds of the formula $C_xF_yH_z$ wherein $x \geq 0$, $y \geq 0$, and $z \geq 0$ (e.g., $CF_4$, $CF_3H$, $CF_2H_2$, $CFH_3$). In these gas combination compositions, gases containing both carbon and fluorine atoms can be in group (A) and/or group (B), provided that at least two different gas species are present in the composition.

The gas combination composition in various specific embodiments can comprise at least one and up to 10 gases from group (A), and at least one and up to ten gases from group (B).

The gas combination composition can be in a form of a gas mixture of the respective gases of group (A) and group (B), or the respective gases can be in co-flow relationship to one another. As used herein, the term "co-flow relationship" means that the group (A) gas(es) are concurrently flowed with the group (B) gas(es) to a same ion implanter, and during at least part of said flow are separated from one another, e.g., in separate flow passages. Thus, the group (A) and group (B) gases may be in an initial mixed form, in a common supply vessel containing the group (A) and group (B) gases. Alternatively, the group (A) gas(es) may be in separate feed line(s) to the ion implanter, in relation to the feed line(s) of the group (B) gas(es). As a further alternative, the feed line(s) for the group (A) gas(es) and the feed line(s) for the group (B) gas(es) may terminate at a flow passage upstream from the ion implanter, so that the gases are mixed together in the flow passage, and the resulting gas mixture enters the ion implanter from such flow passage, so that the respective group (A) and group (B) gas flows are separated from one another for part of their flow to the ion implanter, and are in mixture with one another for part of their flow to the ion implanter.

As regards the relative proportions of the group (A) gas(es) to the group (B) gas(es), each of the group (A) gas(es) and group (B) gas(es) may be from 0.001% by volume to 99.999% by volume, based on total volume of the group (A) and group (B) gases, with the volume percentages of the group (A) gases and group (B) gases in the composition totaling to 100 volume %.

In one embodiment, the relative proportion of the group (B) gas(es) in the combination composition of group (A)

gases and group (B) gases is from 0.001% to 20% by volume, based on total volume of the group (A) and group (B) gases.

In another embodiment, the use of $NF_3$ as a group (B) fluorocompound in combination with group (A) carbon dopant source gas has been demonstrated to provide significant improvement in beam current in the ion implanter, at $NF_3$ concentrations on the order of 0.5%-15%, and more preferably 0.5%-10%, by volume, based on total volume of the gas combination composition.

Thus, the disclosure contemplates a gas combination composition comprising (A) one or more carbon dopant source gas(es) and (B) one or more fluorocompound gas(es), wherein the carbon dopant source gas(es) (A) is/are selected from the group consisting of CO, $CO_2$, $CF_4$, $COF_2$, and $C_aO_xH_yF_z$ wherein a≥1, x≥0, y≥0 and z≥0, and the fluorocompound gas(es) (B) is/are selected from the group consisting of $F_2$, $COF_2$, $CF_4$, $MoF_6$, $B_2F_4$, $NF_3$, $XeF_2$, $BF_3$, $SF_6$, $GeF_4$, $SiF_4$, $WF_6$, compounds of the formula $X_yF_z$ wherein X is any element in stoichiometric ratio with F, y≥1, and z≥1, compounds of the formula $C_aO_xH_yF_z$ wherein a≥0, x≥0, y≥0 and z≥1, and compounds of the formula $C_xF_yH_z$ wherein x≥0, y>0, and z≥0. In such gas combination compositions, gases containing both carbon and fluorine atoms can be in group (A) and/or group (B).

In various specific embodiments of the gas combination compositions, at least one and up to 10 gases from group (A) can be present, in combination with at least one and up to ten gases from group (B). The gas combination composition can be constituted in various embodiments so that each of the group (A) gas(es) and group (B) gas(es) has a concentration in a range of from 0.001% by volume to 99.999% by volume, based on total volume of the group (A) and group (B) gases, with the volume percentages of all group (A) gases and group (B) gases in the composition totaling to 100 volume %. In a specific embodiment, the relative proportion of the group (B) gas(es) in the combination composition of group (A) gases and group (B) gases is from 0.001% to 20% by volume, based on total volume of the group (A) and group (B) gases, with the volume percentages of all group (A) gases and group (B) gases in the composition totaling to 100 volume %. In one embodiment, the group (B) gas(es) comprise $NF_3$. Such $NF_3$ may be present at concentration of approximately 0.5%-15%, and more preferably 0.5%-10%, by volume, based on total volume of the group (A) and group (B) gases, with the volume percentages of all group (A) gases and group (B) gases in the composition totaling to 100 volume %.

The disclosure in a further embodiment relates to a method of ion implantation of carbon in a substrate, comprising carbon doping the substrate using a gas combination composition as described hereinabove. The substrate in such method may be of any suitable type. In various specific embodiments, the substrate can comprise a microelectronic substrate, an optoelectronic substrate, an optical substrate, a superconducting substrate, a semiconducting substrate, a photovoltaic substrate, or other type of substrate. In other specific embodiments, the substrate can comprise a substrate selected from among semiconductor substrates, solar panel substrates, LED substrates, and flat panel substrates.

A further aspect of the disclosure relates to a method of improving beam current in a carbon ion implantation process, wherein carbon dopant source material is delivered to the ion implantation process in mixture and/or co-flow relationship with one or more fluorocompound gas(es) selected from the group consisting of $F_2$, $COF_2$, $CF_4$, $MoF_6$, $B_2F_4$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, y≥1, and z≥1, compounds of the formula $C_aO_xH_yF_z$ wherein a≥0, x≥0, y≥0 and z≥1, and compounds of the formula $C_xF_yH_z$ wherein x≥0, y>0, and z≥0. In one embodiment of such method, the fluorocompound gas(es) comprises $NF_3$.

A still further aspect of the disclosure relates to an ion implantation system, comprising:
an ion implanter configured to receive carbon dopant source material, generate carbon dopant species therefrom, and implant the carbon dopant species in a substrate; and
a supply assembly arranged to deliver carbon dopant source material to the ion implanter, wherein the carbon dopant source material is in mixture with or in co-flow relationship to one or more fluorocompound gas(es) selected from the group consisting of $F_2$, $COF_2$, $CF_4$, $MoF_6$, $B_2F_4$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, y≥1, and z≥1, compounds of the formula $C_aO_xH_yF_z$ wherein a≥0, x≥0, y≥0 and z≥1, and compounds of the formula $C_xF_yH_z$ wherein x≥0, y>0, and z≥0. In one embodiment of such system, the carbon dopant source material comprises one or more gas(es) selected from the group consisting of CO, $CO_2$, $CF_4$, $COF_2$, and $C_aO_xH_yF_z$ wherein a≥1, x≥0, y≥0 and z≥0. In another embodiment of such system, the fluorocompound gases comprise $NF_3$. In additional embodiments of the disclosure, the fluorocompound gas(es) comprises $CF_4$ or $CFH_3$. In still other embodiments of the disclosure, the carbon dopant source material comprises $CO_2$ or $COH_2$.

The use of carbon dopant source material co-flowed to the ion implanter with at least one co-flow gas or is flowed to the ion implanter in mixture with at least one additional gas, in accordance with the present disclosure, can be employed to enhance operational character of the ion implanter in at least one of recipe transition, beam stability, source life, beam uniformity, beam current, and cost of ownership, relative to corresponding operation of the ion implanter without any such co-flow gas or additional gas.

The vessels utilized in the practice of the disclosure for delivery of carbon dopant source gases or co-flow gases can be of any suitable type, and can for example include vessels utilizing solid adsorbent media for storage of the corresponding gas, gas vessels of such type being available from ATMI, Inc. (Danbury, Conn., USA) under the trademarks SDS and SAGE.

Alternatively, or additionally, vessels utilized for delivery of carbon dopant source gas or other gases in the practice of the present disclosure may comprise vessels having one or more regulators interiorly disposed in the interior volume of the vessel, wherein each regulator is set at a set point permitting dispensing of gas at the set point pressure when external flow circuitry coupled with the vessel is at pressure below the set point. Vessels of such type are commercially available from ATMI, Inc. (Danbury, Conn., USA) under the trademark VAC.

The ion implantation processes and systems of the present disclosure may be utilized to manufacture semiconductor product articles, solar panels or solar cells, LEDs, LED displays, flat panel displays, or components, subassemblies or portions of such products.

In addition to the supply of specific carbon dopant source gases in accordance with the present disclosure, the disclosure contemplates co-flows of other gases in connection with the implantation operation, including, for example, co-flow of krypton and hydrogen, or flows or co-flows of other non-dopant gases, as carrier media, cleaning gases, etc.

The carbon dopant source gases described herein may in various embodiments comprise isotopically enriched dopant source gases.

In various embodiments, halide cleaning agents may be incorporated with the carbon dopant source gas, to provide a cleaning function in situ in the ion implanter or parts thereof, such as the ion source, beamline, turbopumps, roughing pumps, etc.

The features and advantages of the ion implantation methods and systems of the present disclosure are more fully shown with reference to the following non-limiting example.

EXAMPLE

Tests were conducted utilizing an ion implant source test stand with an IHC source. In these tests, carbon monoxide (CO) was used as the carbon dopant source gas, and nitrogen trifluoride ($NF_3$) and xenon difluoride ($XeF_2$) were separately employed in respective test runs as the fluoro species co-flowed with the CO to the ionization chamber.

Figure 2:
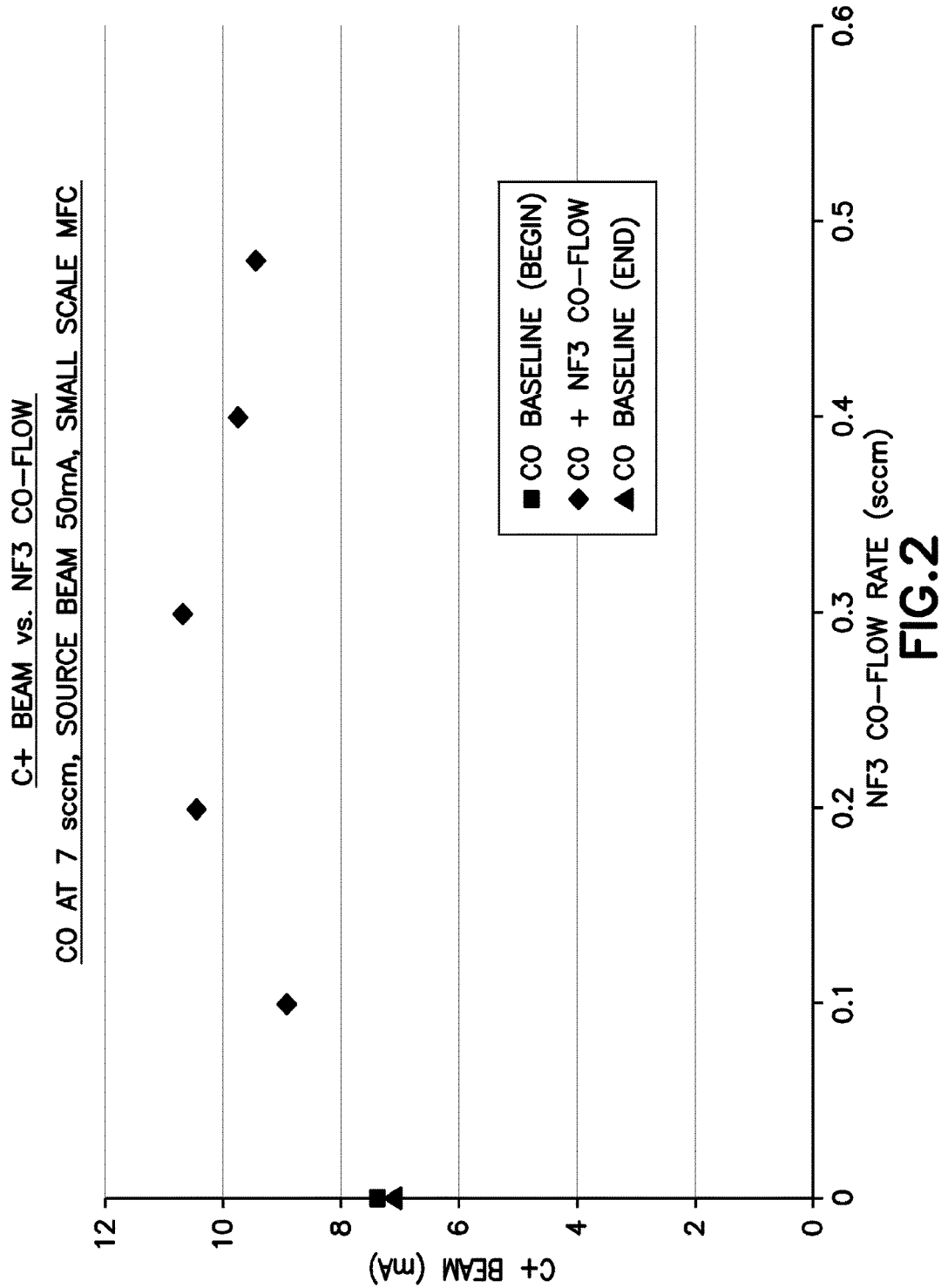
FIG. 2 is a graph of carbon dopant species beam current (C+ Beam, in milliamps) plotted as a function of $NF_3$ co-flow rate, in standard cubic centimeters per minute (sccm), at a source beam current of 50 mA.
Figure 3:
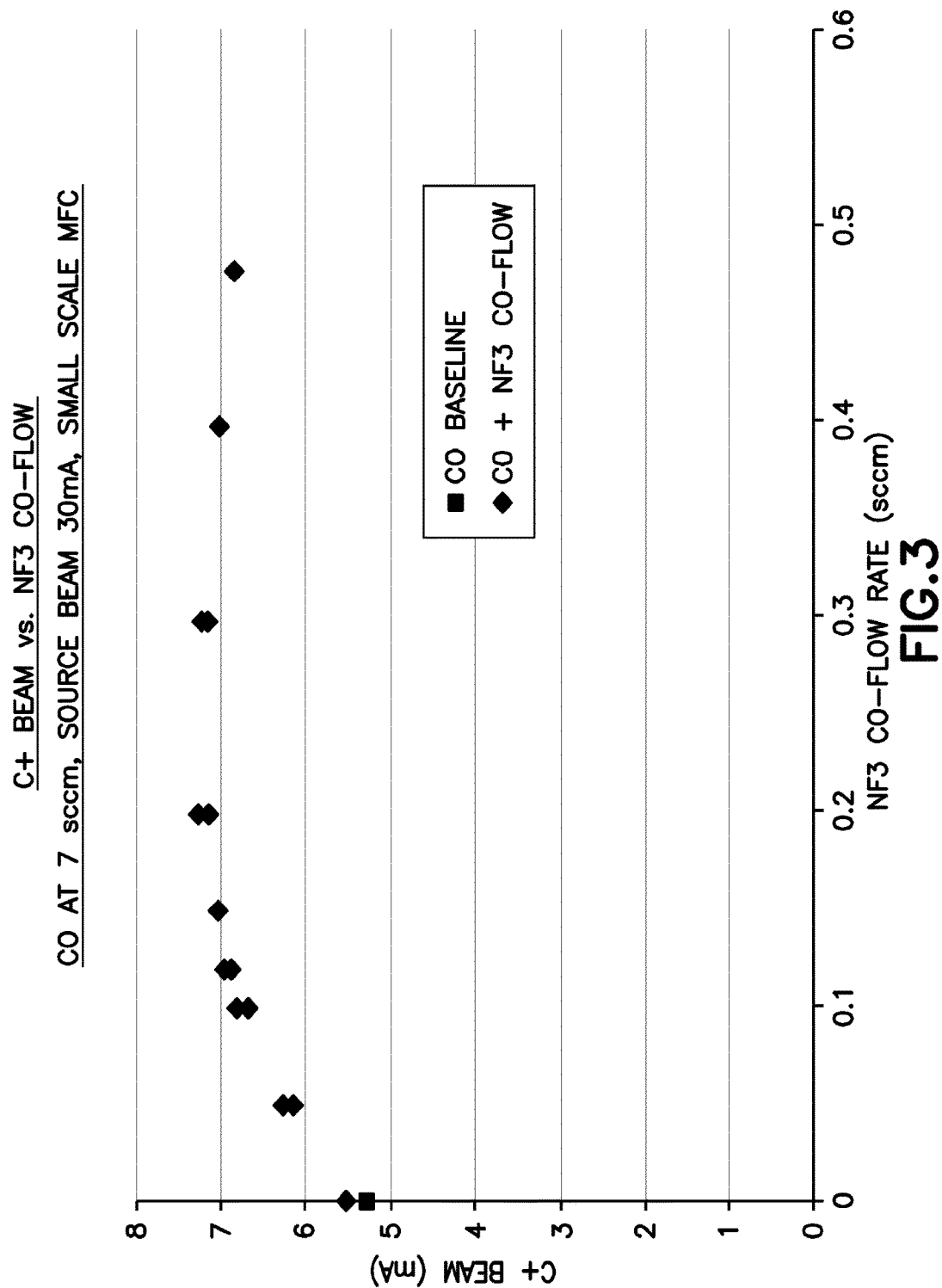
FIG. 3 is a graph of carbon dopant species beam current (C+ Beam, in milliamps) plotted as a function of $NF_3$ co-flow rate, in standard cubic centimeters per minute (sccm), at a source beam current of 30 mA.

In the tests utilizing $NF_3$ as the fluoro species, the ion implant carbon ion (C+) beam current was determined at an arc voltage (ArcV) of 110V, and source beam current of 50 mA and 30 mA in the respective runs. The CO flow rate was maintained at 7 sccm. The $NF_3$ co-flow flow rate was varied from 0 to 0.48 sccm. The tests showed that maximum beam current was achieved at an $NF_3$ co-flow rate in a range of from 0.2 sccm to 0.3 sccm, corresponding to about 3 vol. % to 4 vol. % $NF_3$, based on total flow of $NF_3$ and CO. The test results are shown in FIGS. 2 and 3, in each of which the carbon dopant species beam current (C+ Beam, in milliamps) is plotted as a function of $NF_3$ co-flow rate, in standard cubic centimeters per minute (sccm).

Similar test results were obtained using $XeF_2$ co-flowed with the CO carbon dopant source gas.

Thus, while the disclosure has been set out in descriptions of specific embodiments, it will be appreciated that the disclosure is susceptible to various modifications, variations and alternative embodiments to those shown, and all such variations, modifications and alternative embodiments are to be regarded as being within the broad scope of disclosure herein, with respect to the claims to the invention hereinafter set forth.

What is claimed is:

1. An ion implantation method, comprising:
flowing a carbon dopant source composition to an ion implanter configured for carbon doping of a substrate; and
operating the ion implanter to generate carbon dopant species from the carbon dopant source composition and to implant the carbon dopant species in the substrate, wherein the carbon dopant source composition is co-flowed to the ion implanter with at least one co-flow gas or is flowed to the ion implanter in mixture with at least one additional gas, wherein the at least one co-flow gas or at least one additional gas comprises gas selected from the group consisting of: $GeH_4$, $SiH_4$, $XeF_2$, $BF_3$, $SF_6$, $GeF_4$, $SiF_4$, $NF_3$, $N_2F_4$, HF, $WF_6$, $MoF_6$, $PF_3$, $PF_5$, and $B_2F_4$,
wherein said operating generates a beam current, and the at least one co-flow gas or the at least one additional gas increases the beam current in a mixture of the carbon dopant source and the at least one co-flow gas or the at least one additional gas, as compared to the carbon dopant source without the at least one co-flow gas or the at least one additional gas.

2. The method of claim 1, wherein the carbon dopant source composition comprises at least one carbon dopant source material selected from the group consisting of: CO; $CO_2$; $CF_4$; $CH_4$; $COF_2$; $CH_2O$; $C_2F_4H_2$; $C_2H_6$; compounds of the formula $C_xF_wO_yH_zCl_vN_u$, wherein x is greater than or equal to 1, w is greater than or equal to 0, y is greater than or equal to 0, z is greater than or equal to 0, v is greater than or equal to 0, and u is greater than or equal to 0, with the proviso that at least one of w, y, z, v, and u has a non-zero value; hydrocarbons; alkanes; cyclic alkanes; alkenes; cyclic alkenes; polyenes; cyclic polyenes; alkynes; cyclic alkynes; arenes, and their derivatives; partially and fully halogenated hydrocarbons; alcohols of general formula ROH, wherein R is an organo moiety; halogenated alcohols; aldehydes; ethers; halogenated ethers; esters; halogenated esters; primary amines; secondary amines; tertiary amines; halogenated amines; N-halogenated amines; nitro ($RNO_2$) and nitroso (RNO) alkyl and halogenated alkyl compounds; halides, wherein the number of carbon atoms is 1; halides containing two carbon atoms; and halides and hydrides containing multiple carbon atoms.

3. The method of claim 1, wherein the carbon dopant source composition comprises at least one carbon dopant source material selected from the group consisting of: CO; $CO_2$; $CF_4$; $CH_4$; $COF_2$; $CH_2O$; $C_2F_4H_2$; and $C_2H_6$.

4. The method of claim 1, wherein the carbon dopant source composition comprises CO.

5. The method of claim 1, wherein the carbon dopant source composition comprises $CO_2$.

6. The method of claim 1, wherein the carbon dopant source composition comprises $CF_4$.

7. The method of claim 1, wherein the carbon dopant source composition comprises $CH_4$.

8. The method of claim 1, wherein the carbon dopant source composition comprises $COF_2$.

9. The method of claim 1, wherein the at least one co-flow gas or at least one additional gas comprises $NF_3$.

10. The method of claim 9, wherein the carbon dopant source composition comprises CO.

11. The method of claim 9, wherein the carbon dopant source composition comprises $CO_2$.

12. The method of claim 9, wherein the carbon dopant source composition comprises $CF_4$.

13. The method of claim 9, wherein the carbon dopant source composition comprises $CH_4$.

14. The method of claim 9, wherein the carbon dopant source composition comprises $COF_2$.

15. The method of claim 1, wherein the substrate comprises a semiconductor substrate, solar panel substrate, LED substrate, or flat panel substrate.

16. The method of claim 1, wherein the at least one co-flow gas or the at least one additional gas is present in an amount in the range of 0.001 to 20% (volume) of a mixture of the carbon dopant source and the at least one co-flow gas or the at least one additional gas.

17. The method of claim 16, wherein the at least one co-flow gas or the at least one additional gas is present in an amount in the range of 0.5 to 15% (volume) of the mixture.

18. The method of claim 17, wherein the at least one co-flow gas or the at least one additional gas is present in an amount in the range of 0.5 to 10% (volume) of the mixture.

* * * * *